United States Patent
Perault et al.

(10) Patent No.: US 7,121,199 B2
(45) Date of Patent: Oct. 17, 2006

(54) METHOD AND APPARATUS FOR SUPPORTING AND CLAMPING A SUBSTRATE

(75) Inventors: Joseph A. Perault, Natick, MA (US); James Lynch, Uxbridge, MA (US)

(73) Assignee: Speedline Technologies, Inc., Franklin, MA (US)

( * ) Notice: Subject to any disclaimer, the term of this patent is extended or adjusted under 35 U.S.C. 154(b) by 117 days.

(21) Appl. No.: 10/967,450

(22) Filed: Oct. 18, 2004

(65) Prior Publication Data

US 2006/0081138 A1 Apr. 20, 2006

(51) Int. Cl.
*B05C 17/06* (2006.01)

(52) U.S. Cl. .................. 101/126; 101/127; 101/129; 118/213

(58) Field of Classification Search ............ None
See application file for complete search history.

(56) References Cited

U.S. PATENT DOCUMENTS

| | | | |
|---|---|---|---|
| 5,092,510 A * | 3/1992 | Anstrom et al. ............. 228/5.5 |
| 5,157,438 A | 10/1992 | Beale | |
| RE34,615 E | 5/1994 | Freeman | |
| 5,707,052 A | 1/1998 | Adams et al. | |
| 5,815,912 A | 10/1998 | Willshere et al. | |
| 5,974,654 A | 11/1999 | Morita | |
| 6,695,298 B1 | 2/2004 | Hertz et al. | |
| 6,726,195 B1 | 4/2004 | Hertz et al. | |
| 2002/0020346 A1 | 2/2002 | Doyle et al. | |
| 2002/0138977 A1 | 10/2002 | Nagao et al. | |
| 2004/0142099 A1 | 7/2004 | Rossmeisl et al. | |

FOREIGN PATENT DOCUMENTS

WO WO 03/006243 A1 1/2003

OTHER PUBLICATIONS

International Search Report for PCT/US2005/037199 dated Feb. 27, 2006.

* cited by examiner

*Primary Examiner*—Andrew H. Hirshfeld
*Assistant Examiner*—Marissa Ferguson-Samreth
(74) *Attorney, Agent, or Firm*—Lowrie, Lando & Anastasi, LLP

(57) ABSTRACT

A stencil printer for printing viscous material on a substrate includes a frame, a stencil coupled to the frame, and a print head, coupled for the frame, to deposit and print viscous material over the stencil. The stencil printer further includes a substrate supporting and clamping assembly to support and clamp a substrate in a print position. The substrate supporting and clamping assembly includes at least one support member to support the substrate in a print position, a pair of rail members, coupled to the frame, adapted to engage opposite edges of the substrate, and a clamping mechanism, coupled to the frame, to move at least one of the rail members against the substrate to clamp the substrate. The clamping mechanism includes at least one piston to move the at least one of the rail members between a first position in which the rail member is spaced away from one of the opposite edges of the substrate and a second position in which the rail member engages one of the opposite edges of the substrate to clamp the substrate between the rail members during a print operation. The clamping mechanism further includes a pressure regulator to control a clamping force applied by the piston to the rail member against the edge of the substrate. A method for supporting and clamping a substrate in a print position is further disclosed.

26 Claims, 4 Drawing Sheets

METHOD AND APPARATUS FOR SUPPORTING AND CLAMPING A SUBSTRATE

BACKGROUND OF INVENTION

1. Field of Invention

The present invention relates generally to substrate support assemblies for supporting and stabilizing a substrate within a machine that performs an operation on the substrate, and more particularly to a substrate support assembly of a stencil printer particularly designed to clamp edges of the substrate during a print operation.

2. Discussion of Related Art

In a typical surface-mount circuit board manufacturing operation, a stencil printer is used to print solder paste onto a printed circuit board. A circuit board, broadly referred to as an electronic substrate, having a pattern of pads or some other conductive surface onto which solder paste will be deposited, is automatically fed into the stencil printer. One or more small holes or marks on the circuit board, called fiducials, is used to properly align the circuit board with the stencil or screen of the stencil printer prior to the printing of solder paste onto the circuit board. Once a circuit board has been properly aligned with the stencil in the printer, the circuit board is raised to the stencil by a substrate support, e.g., a table having pins, and fixed with respect to the stencil. Solder paste is then dispensed onto the stencil, and a wiper blade or squeegee traverses the stencil to force the solder paste through apertures formed in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste is typically dispensed onto the stencil from a standard cartridge. After the print operation, the board is then released, lowered away from the stencil, and transported to another station within the printed circuit board fabrication line.

There are a number of well-know methods for clamping the circuit board so that it is stabilized during the print operation. Once such method is disclosed in U.S. Pat. No. 5,157,438 to Beale, which discloses a clamping mechanism having very thin foils that project over opposite edges of the circuit board for securing the circuit board to the support assembly. One disadvantage associated with this approach is that the foils and the substrate support, while preventing up and down movement of the substrate in the z direction, fail to prevent lateral movement of the substrate in the x and y directions. Even though such movement is somewhat limited, it is imperative to eliminate any movement of the substrate so that solder paste is accurately dispensed onto the substrate.

SUMMARY OF INVENTION

Embodiments of the invention provide improvements to stencil support assemblies, such as those described above.

A first aspect of the invention is directed to a stencil printer for printing viscous material on a substrate. The stencil printer comprises a frame, a stencil coupled to the frame, and a print head, coupled for the frame, to deposit and print viscous material over the stencil. The stencil printer further comprises a substrate supporting and clamping assembly to support and clamp a substrate in a print position. The substrate supporting and clamping assembly comprises at least one support member to support the substrate in a print position, a pair of rail members, coupled to the frame, adapted to engage opposite edges of the substrate, and a clamping mechanism, coupled to the frame, to move at least one of the rail members against the substrate to clamp the substrate. In one embodiment of the invention, the clamping mechanism comprises at least one piston to move the at least one of the rail members between a first position in which the rail member is spaced away from one of the opposite edges of the substrate and a second position in which the rail member engages one of the opposite edges of the substrate to clamp the substrate between the rail members during a print operation. The clamping mechanism further comprises a pressure regulator to control a clamping force applied by the piston to the rail member against the edge of the substrate, wherein the clamping force is between 1 and 35 pounds. The stencil printer further includes a substrate support system for supporting interior regions of the substrate. In one aspect of the invention, the substrate support system comprises a flexible support member. In another aspect of the invention, the substrate support system comprises a plurality of pins adapted to engage and support the bottom surface of the substrate. The at least one support member is constructed and arranged to raise the substrate into the print position. The supporting and clamping assembly further comprises a foil member to prevent a z directional movement of the substrate.

A second aspect of the invention is directed to a substrate supporting and clamping assembly for supporting and clamping a substrate in a print position during a print operation of a stencil printer. The substrate supporting and clamping assembly comprises at least one support member to support the substrate in a print position, a pair of rail members adapted to engage opposite edges of the substrate, and a clamping mechanism to move at least one of the rail members against the substrate to clamp the substrate. In one embodiment of the present invention, the clamping mechanism comprises at least one piston to move the at least one of the rail members between a first position in which the rail member is spaced away from one of the opposite edges of the substrate and a second position in which the rail member engages one of the opposite edges of the substrate to clamp the substrate between the rail members during a print operation. The clamping mechanism further comprises a pressure regulator to control a clamping force applied by the piston to the rail member against the edge of the substrate, wherein the clamping force is between 1 and 35 pounds. The substrate supporting and clamping assembly further comprises a substrate support system for supporting interior regions of the substrate. In one aspect of the invention, the substrate support system comprises a flexible support member. In another aspect of the invention, the substrate support system comprises a plurality of pins adapted to engage and support the bottom surface of the substrate. The at least one support member is constructed and arranged to raise the substrate into the print position. The supporting and clamping assembly further comprises a foil member to prevent a z directional movement of the substrate.

A third aspect of the invention is directed to a substrate supporting and clamping assembly for supporting and clamping a substrate in a print position during a print operation of a stencil printer. The substrate supporting and clamping assembly comprises means for engaging a bottom surface of the substrate in a print position, and means for clamping opposite edges of the substrate. In one embodiment of the invention, the means for clamping comprises a pair of rail members and a piston to move the at least one of the rail members between a first position in which the rail member is spaced away from one of the opposite edges of the substrate and a second position in which the rail member engages one of the opposite edges of the substrate to clamp the substrate between the rail members during a print operation. The means for clamping further comprises means for controlling a clamping force applied by the piston to the rail member against the edge of the substrate, wherein the clamping force is between 1 and 35 pounds. The substrate supporting and clamping assembly further comprises means for raising the substrate to the print position. The substrate supporting and clamping assembly further comprises means for preventing a z directional movement of the substrate.

A fourth aspect of the invention is directed to a method for supporting and clamping a substrate in a print position during a print operation of a stencil printer. The method comprises supporting the substrate at the print position, and clamping opposite edges of the substrate. In one embodiment of the invention, the method further comprises controlling a clamping force at which the substrate is clamped, wherein the clamping force is between 1 and 35 pounds. The method further comprises raising the substrate to the print position, and preventing a z directional movement of the substrate.

A fifth aspect of the invention is directed to an apparatus for performing an operation on an electronic substrate. The apparatus comprises a frame, a module coupled to the frame to perform an operation on the electronic substrate, a substrate support coupled to the frame to support a substrate in an operating position, and a substrate clamping assembly coupled to the frame. The substrate clamping assembly comprises a pair of rail members coupled to the frame, the rail members being adapted to engage opposite edges of the substrate. The clamping assembly further comprises a clamping mechanism, coupled to the frame, to move at least one of the rail members against the substrate to clamp the substrate. In one embodiment of the invention, the clamping mechanism comprises at least one piston to move the at least one of the rail members between a first position in which the rail member is spaced away from one of the opposite edges of the substrate and a second position in which the rail member engages one of the opposite edges of the substrate to clamp the substrate between the rail members during a print operation. The clamping mechanism further comprises a pressure regulator to control a clamping force applied by the piston to the rail member against the edge of the substrate, wherein the clamping force is between 1 and 35 pounds.

A sixth aspect of the invention is directed to a substrate clamping assembly for clamping a substrate in a position during an operation on an electronic substrate. The substrate clamping assembly comprises a pair of rail members adapted to engage opposite edges of the substrate, and a clamping mechanism to move at least one of the rail members against the substrate to clamp the substrate. In one embodiment of the invention, the clamping mechanism comprises at least one piston to move the at least one of the rail members between a first position in which the rail member is spaced away from one of the opposite edges of the substrate and a second position in which the rail member engages one of the opposite edges of the substrate to clamp the substrate between the rail members during a print operation. The clamping mechanism further comprises a pressure regulator to control a clamping force applied by the piston to the rail member against the edge of the substrate, wherein the clamping force is between 1 and 35 pounds.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
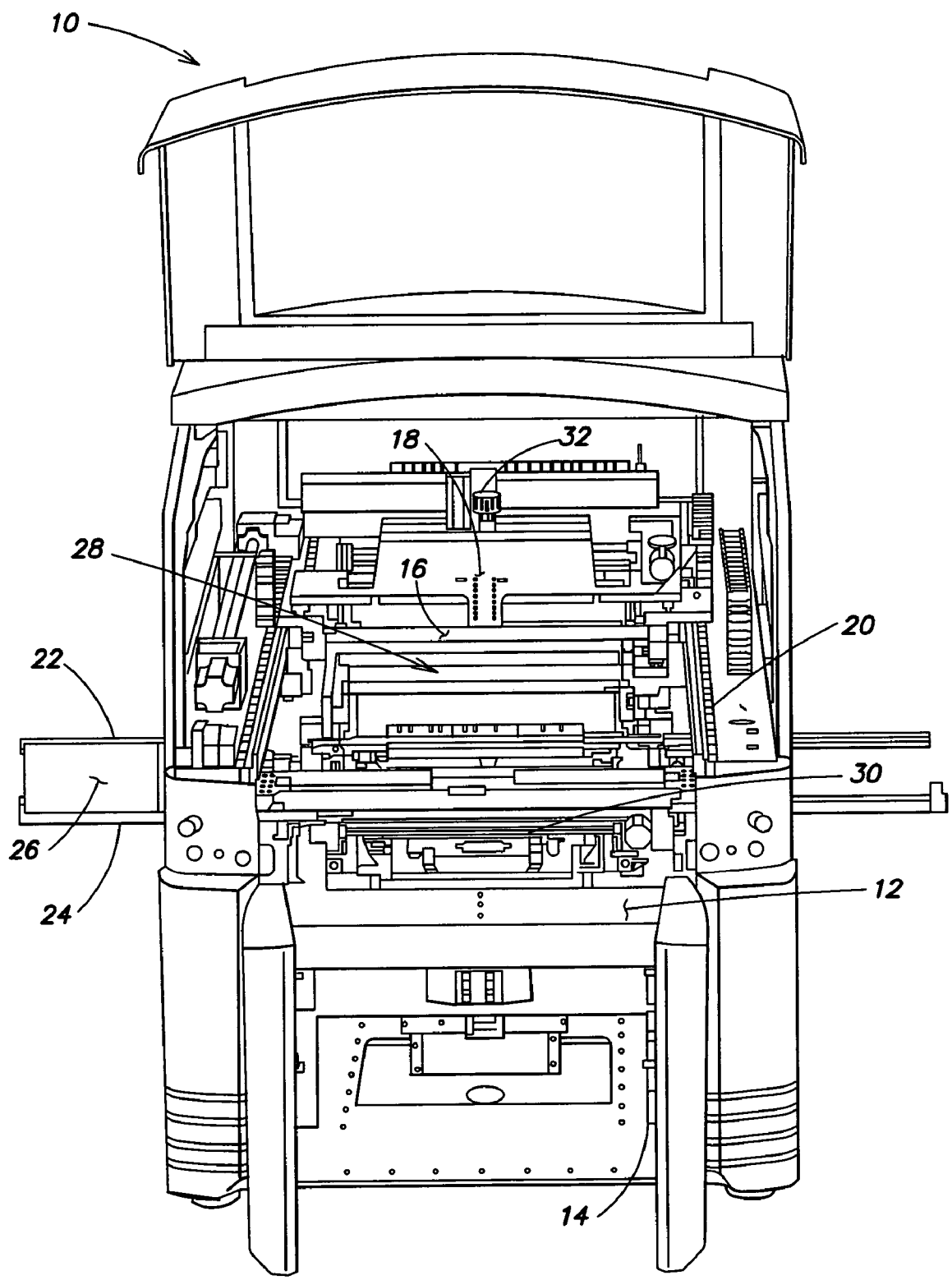
FIG. 1 shows a front perspective view of a stencil printer having a clamping assembly of an embodiment of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the present invention will now be described with reference to a stencil printer used to print solder paste onto a printed circuit board. One skilled in the art will appreciate, however, that embodiments of the present invention are not limited to stencil printers that print solder paste onto circuit boards, but rather, may be used in other applications requiring dispensing of other viscous materials, such as glues and encapsulents. For example, embodiments of the present invention can also be used in dispensers, reflow ovens, wave solder machines, and pick and place machines, or any other apparatus used to secure a component to an electronic substrate (e.g., a printed circuit board) during a work operation. Further, stencil printers in accordance with embodiments of the present invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

FIG. 1 shows a stencil printer, generally indicated at 10, including a frame 12 that supports components of the stencil printer. The components, in part, include a controller 14, a stencil 16, and a print head 18 having a dispensing slot (not shown) from which solder paste may be dispensed. Each of these components is suitably coupled to the frame 12. The print head 18 is on a gantry 20, which enables the print head to be moved in the x, y and z directions under the control of the controller 14. As described below in further detail, the print head 18 is placed over the stencil 16 and moved across the stencil to allow printing of solder paste onto a circuit board.

Stencil printer 10 also includes a conveyor system having rails 22, 24 for transporting a circuit board 26 to a print position in the stencil printer. The stencil printer 10 has an assembly, generally indicated at 28, for supporting and clamping the printed circuit board 26 (or "substrate"), which, as will be described in greater detail below, raises and clamps the printed circuit board so that it is stable during a print operation. The substrate supporting and clamping assembly 28 further includes a substrate support system 30, e.g., a plurality of pins or flexible tooling, positioned beneath the circuit board 26 when the circuit board is in the print position. The substrate support system 30 is used, in part, to support the interior regions of the circuit board 26 to prevent flexing or warping of the circuit board during the print operation.

The print head 18 is configured to receive at least one solder paste cartridge 32 that provides solder paste to the print head during the print operation. Although not illustrated in FIG. 1, the solder paste cartridge 32 is coupled to one end of a pneumatic air hose, while the other end of the pneumatic air hose is attached to a compressor that, under the control of the controller 14, provides pressurized air to the cartridge to force solder paste out of the cartridge into the print head 18 and onto the stencil 16. Mechanical devices, such as a piston, may be used in addition to, or in place of, air pressure to force the solder paste from the cartridge 32 into the print head 18. The controller 14 is implemented using a personal computer having a Microsoft DOS or Windows XP operating system with application specific software to control the operation of the stencil printer 10.

The stencil printer 10 operates as follows. A circuit board 26 is loaded into the stencil printer 10 using the conveyor rails 22, 24. The supporting and clamping assembly 28 raises and clamps the circuit board 26 to a print position. The print head 18 is then lowered in the z direction until blades of the print head contact the stencil 16. The print head 18 is then moved in the x direction across the stencil 16. The print head 18 deposits solder paste out of the dispensing slot of the print head through apertures in the stencil 16 and onto the circuit board 26. Once the print head 18 has fully traversed the stencil 16, the circuit board 26 is released, lowered back onto the conveyor rails 22, 24 and transported from the printer 10 so that a second circuit board may be loaded into the printer. To print on the second circuit board, the print head 18 is moved across the stencil 16 in the direction opposite to that used for the first circuit board. Alternatively, a squeegee arm (not shown) could swing inwardly to contain the solder paste in the print head 18, and the print head can then be lifted in the z direction and moved back to its original position to perform a print operation on the second circuit board using a similar direction stroke.

Figure 2:
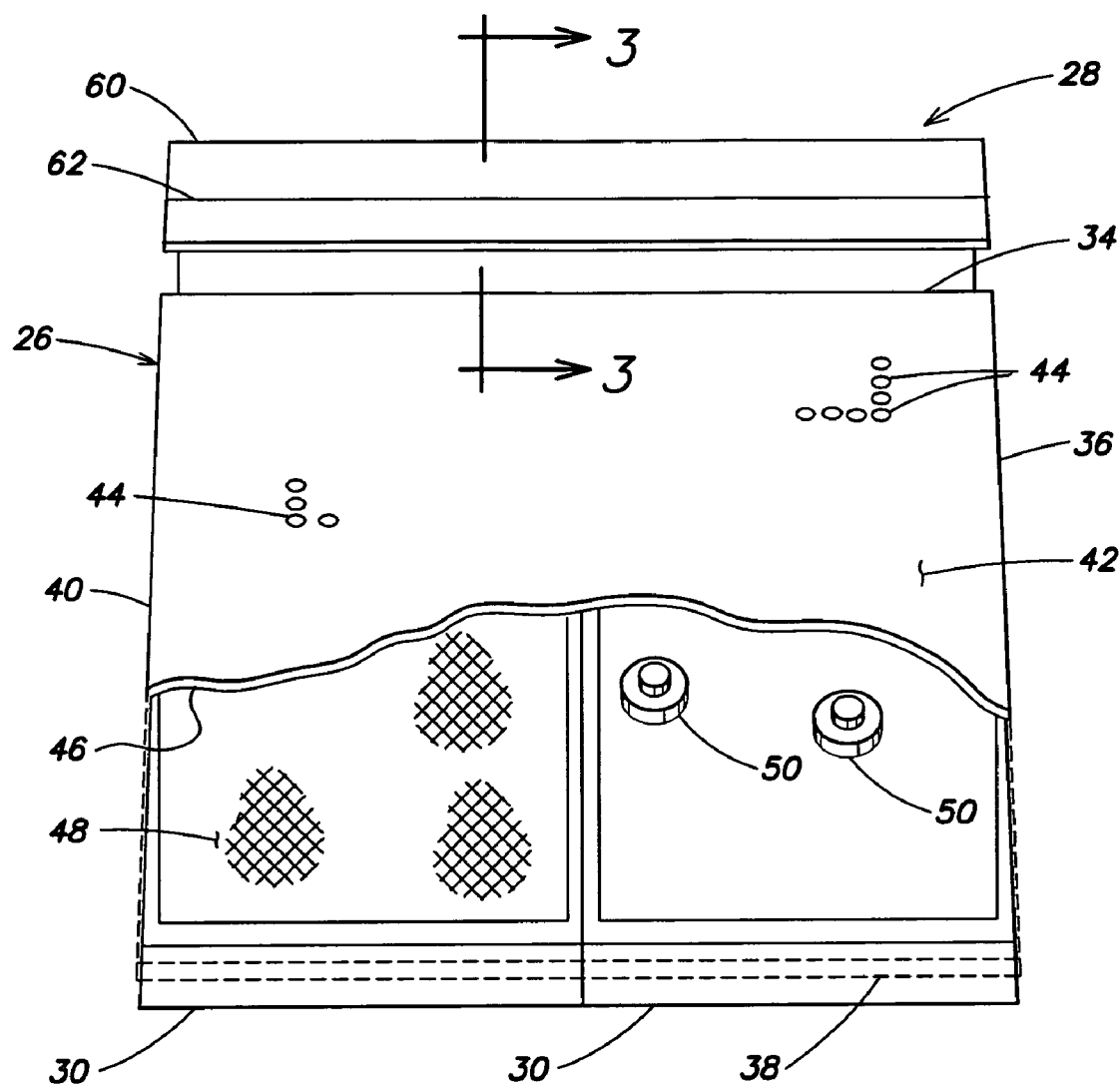
FIG. 2 shows a top perspective, schematic view of the clamping assembly with a substrate, e.g., a printed circuit board, illustrated in a lowered, pre-print position.

Referring to FIG. 2, the construction of the supporting and clamping assembly 28 in accordance with one embodiment is illustrated in greater detail. As shown, the printed circuit board 26 has a thin, rectangular body having four edges 34, 36, 38 and 40, two of which (34, 38) are clamped during a print operation. The circuit board 26 includes a top surface 42 having a plurality of pads 44 which are adapted to have solder paste deposited thereon during the print operation. The underneath or bottom surface 46 of the printed circuit board 26 is supported, in part, by the substrate support system 30, which prevents the printed circuit board from flexing or warping during the print operation. For illustration purposes only, two support systems 30 are shown in FIG. 2. On the left-hand side of FIG. 2, a flexible support system, e.g., gel tooling 48, supports the printed circuit board 26. Such a support system is disclosed in U.S. patent application Ser. No. 10/175,131, entitled METHOD AND APPARATUS FOR SUPPORTING A SUBSTRATE, and U.S. patent application Ser. No. 10/394,814 having the same title, both of which are owned by the assignee of the present invention and are incorporated by reference. The flexible support system 48 is adapted to conform to the bottom surface 46 of the printed circuit board 26 to support the circuit board in a uniform manner. On the right hand side of FIG. 2, the support system 30 comprises a plurality of pins 50 for supporting the printed circuit board 26, which are well-known in the art of stencil printers, and, to a lesser extent, in the art of dispensers. In other embodiments, one support system may be used to support the underneath of the entire circuit board.

Figure 3A:
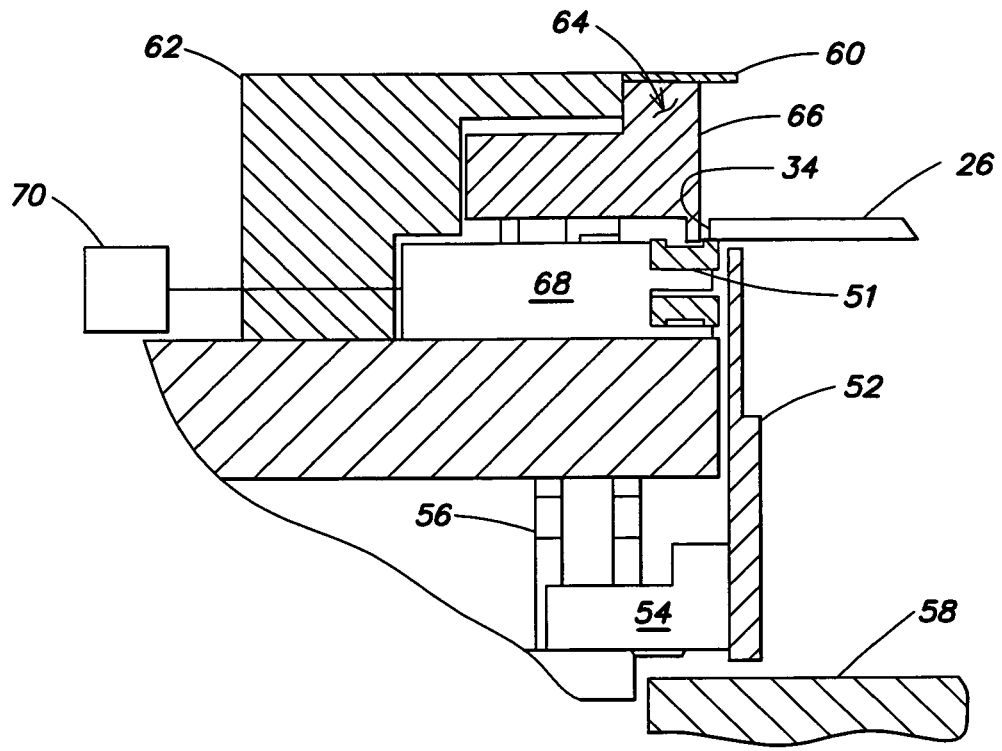
FIG. 3A shows an enlarged cross-sectional view of the clamping assembly taken along line 3—3 in FIG. 2.
Figure 3B:
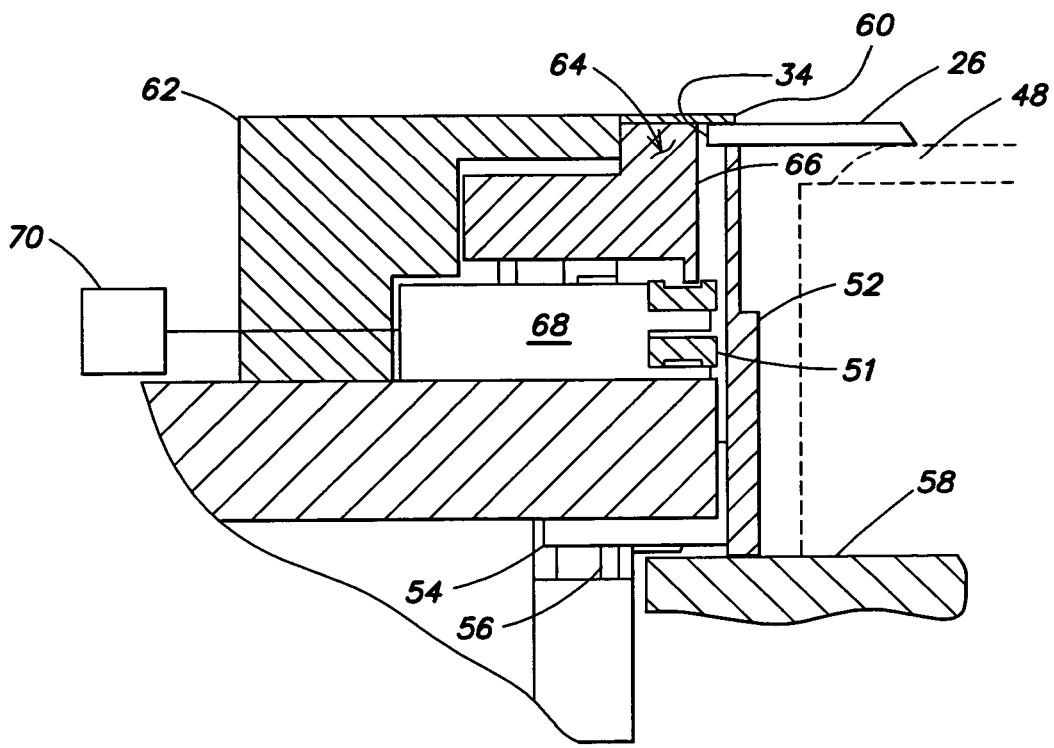
FIG. 3B shows an enlarged cross-sectional view of the clamping assembly taken along line 3—3 in FIG. 2 with the substrate illustrated in a raised position.
Figure 3C:
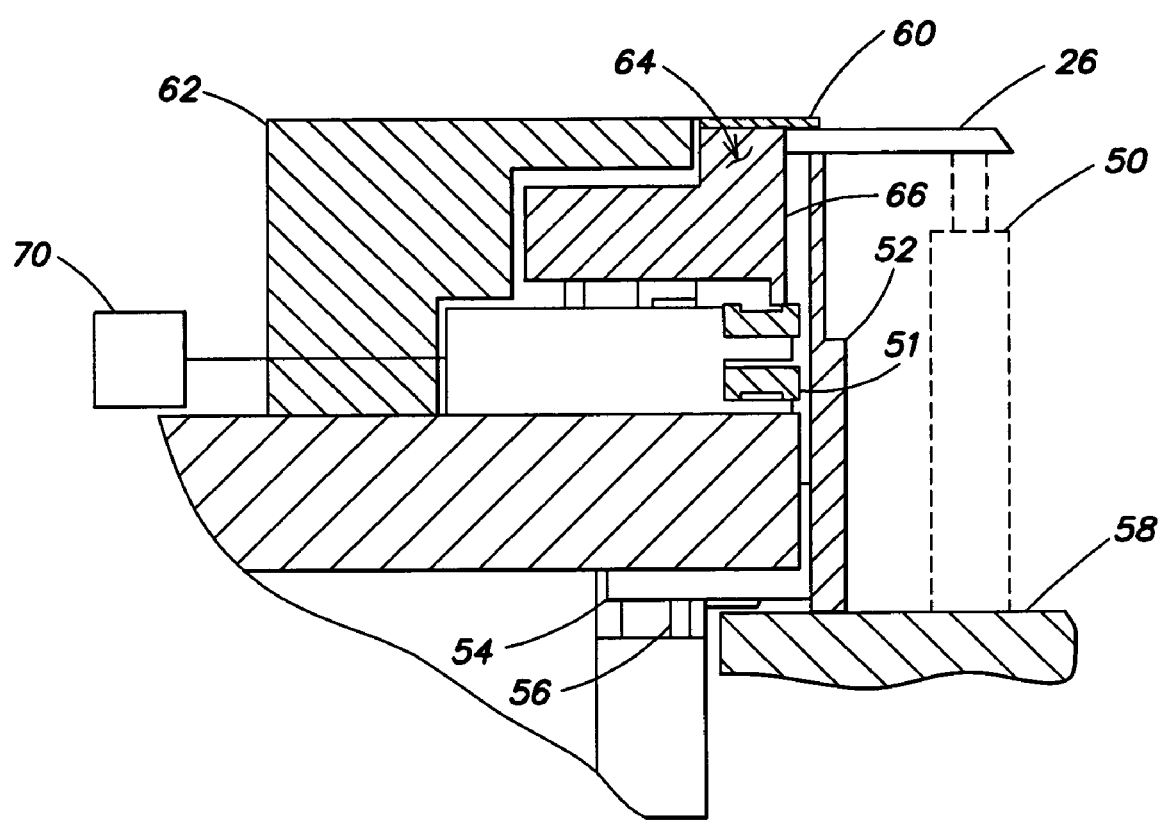
FIG. 3C shows an enlarged cross-sectional view of the clamping assembly taken along line 3—3 in FIG. 2 with the substrate illustrated in a clamped, print position.

Turning now to FIGS. 3A–3C, and more particularly to FIGS. 3A and 3B, circuit boards are transported into and out of the supporting and clamping assembly 28 by a belt transfer assembly, which is configured to support the underside of the board in the area of the edges 34, 38 of a circuit board 26. The belt transfer assembly is part of the conveyor system described above, and cooperates with the rails 22, 24 to transfer circuit boards 26 into and out of the stencil printer 10. Specifically, the belt transfer assembly includes a belt 51 driven by at least one roller (not shown). As shown, the edge 34 of the circuit board 26 rides on top of the belt 51.

The substrate supporting and clamping assembly 28 includes a pair of board support members (one board support member 52 being shown in FIGS. 3A–3C), which engage and support the bottom surface 46 of the printed circuit board 26 along the edges 34, 38 of the printed circuit board. The board support members (including board support member 52) are elongate in shape and extend along the length of the edge (34 and 38) of the printed circuit board 26 to provide support along the entire (or nearly entire) edge of the circuit board. As shown, a mounting block 54 is attached to the board support member 52 and slidably coupled to the frame 12 of the stencil printer 10 by at least one track 56 formed in the frame.

A lift mechanism raises each board support member 52 and the circuit board 26 from a pre-print position (FIG. 3A) to a raised, print position (FIG. 3B) along the track 56. Specifically, a table 58, mechanically coupled to the frame 12, is raised to engage a bottom edge of each board support member 52 to lift the printed circuit board 26 off of the belt 51 in the manner illustrated in FIG. 3B. The weight of the supporting and clamping assembly 28 biases the support members 52 in the pre-print or lowered position. The controller 14 is adapted to control the movement of the circuit board 26 between the pre-print position in which circuit boards are shuttled into and out of the stencil printer 10 by the belt transfer assembly and the raised and print positions in which the print operation is performed on the circuit board.

Once the circuit board 26 is loaded into the stencil printer 10, positioned within the supporting and clamping assembly 28 (FIG. 3A) and raised to its print position (FIG. 3B), the circuit board is clamped to prevent any lateral movement of the circuit board along the plane of the circuit board during the print operation. Specifically, the supporting and clamping assembly 28 includes a foil member 60 to prevent a z directional movement of the circuit board 26. As shown, the foil 60 is connected to a fixed member 62, the foil being positioned to overlap the edge 34 of the circuit board 26.

The supporting and clamping assembly 28 further includes a pair of rail members (only one rail member 64 being shown in FIGS. 3A–3C), which are positioned to engage the opposite edges 34, 38 of the circuit board 26. The rail member 64 illustrated in FIGS. 3A–3C is movable in the manner described below whereas the rail member that is not illustrated in the drawing figures is fixed. In another embodiment, both rail members are movable to clamp the circuit board in a secure position for enabling a print operation. As shown, an inwardly facing surface 66 of the rail member 64 is positioned proximate to the edge 34 of the circuit board 26 when the circuit board is loaded into the stencil printer 10. The other (fixed) rail member has a similar inwardly facing surface that faces the surface 66 of the movable rail member 64.

As shown in FIG. 3C, a clamping mechanism 68 moves the movable rail member 64 against the edge 34 of the circuit board 26 to secure the circuit board between the rail members. The clamping mechanism 68 embodies at least one piston, and preferably two or more pistons provided along the length of the movable rail member 64, to move the rail member between a first position in which the rail member is spaced away from the edge 34 of the circuit board 26 and a second position in which the rail member engages the edge of the substrate to clamp the substrate between the rail members during the print operation. It should be understood that a person having ordinary skill in the art, given the benefit of this disclosure, may employ a different mechanism to move the rail member 64 against the edge 34 of the printed circuit board 26 and still fall within the scope of the instant invention. For example, a cam mechanism can be employed to achieve the movement of the rail member 64 between its first and second positions.

A pressure regulator 70 is further provided to monitor and regulate the pressure applied by the clamping mechanism 68 to the rail member. The pressure regulator 70 communicates with the controller 14 as well as the clamping mechanism 68 so that an operator of the stencil printer 10 can control the clamping force on a circuit board 26. The clamping force applied by the rail member 64 to the circuit board 26 is between 1 and 35 pounds, and preferably between 8 and 15 pounds, and more preferably, the clamping force is approximately 12 pounds. The pressure applied by the clamping mechanism 68 must be sufficient to secure the circuit board 26 firmly between the rail members but not too much so that the circuit board warps due to excessive pressure. It should be noted that the clamping force may be higher than the preferred range for larger circuit boards, and lower than the preferred range for smaller circuit boards. Also, the amount of force applied by the clamping mechanism 68 is related to the thickness of the circuit board being held. Specifically, the thicker the circuit board, the greater the clamping force. Conversely, the thinner the circuit board, the lesser the clamping force.

It should be understood that a person having ordinary skill in the art, given the benefit of this disclosure, may employ a different mechanism to monitor and regulate the force applied by the clamping mechanism 68 to the rail member, such as a sensor.

As stated above, even though only one rail member is configured to clamp the circuit board, both rail members can be manipulated to perform the clamping operation. Also, it should be noted that the rail members can be fabricated from any suitable material to secure the circuit board, e.g., steel.

It should be understood that the supporting and clamping assembly 28 disclosed herein can be implemented in printed circuit board fabrication equipment other than stencil printers. For example, as noted above, the principles disclosed herein can easily be applied to dispensers used to dispense viscous material in printed circuit board fabrication, to wave solder machines, reflow ovens, and in pick and place machines.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A stencil printer for printing viscous material on a substrate, the stencil printer comprising:
   a frame;
   a stencil coupled to the frame;
   a print head, coupled for the frame, to deposit and print viscous material over the stencil; and
   a substrate supporting and clamping assembly to support and clamp a substrate in a print position, the substrate supporting and clamping assembly comprising
   at least one support member to support the substrate in a print position,
   a pair of rail members, coupled to the frame, adapted to engage opposite edges of the substrate, and
   a clamping mechanism, coupled to the frame, to move at least one of the rail members against the substrate to clamp the substrate, said clamping mechanism being configured to move the at least one of the rail members between a first position in which the rail member is spaced away from one of the opposite edges of the substrate and a second position in which the rail member engages one of the opposite edges of the substrate to clamp the substrate between the rail members during a print operation, said clamping mechanism comprising a pressure regulator to control a clamping force applied to the rail member against the edge of the substrate.

2. The stencil printer set forth in claim 1, wherein the clamping force is between 1 and 35 pounds.

3. The stencil printer set forth in claim 1 further comprising a substrate support system for supporting interior regions of the substrate.

4. The stencil printer set forth in claim 3, the substrate support system comprising a flexible support member.

5. The stencil printer set forth in claim 3, the substrate support system comprising a plurality of pins adapted to engage and support the bottom surface of the substrate.

6. The stencil printer set forth in claim 1, wherein the at least one support member is constructed and arranged to raise the substrate into the print position.

7. The stencil printer set forth in claim 1, wherein the supporting and clamping assembly further comprises a foil member to prevent a z directional movement of the substrate.

8. A substrate supporting and clamping assembly for supporting and clamping a substrate in a print position during a print operation of a stencil printer, the substrate supporting and clamping assembly comprising:
   at least one support member to support the substrate in a print position;
   a pair of rail members adapted to engage opposite edges of the substrate; and
   a clamping mechanism to move at least one of the rail members against the substrate to clamp the substrate, said clamping mechanism being configured to move the at least one of the rail members between a first position in which the rail member is spaced away from one of the opposite edges of the substrate and a second position in which the rail member engages one of the opposite edges of the substrate to clamp the substrate between the rail members during a print operation, said clamping mechanism further comprising a pressure regulator to control a clamping force applied to the rail member against the edge of the substrate.

9. The substrate supporting and clamping assembly set forth in claim 8, wherein the clamping force is between 1 and 35 pounds.

10. The substrate supporting and clamping assembly set forth in claim 8 further comprising a substrate support system for supporting interior regions of the substrate.

11. The substrate supporting and clamping assembly set forth in claim 10, the substrate support system comprising a flexible support member.

12. The substrate supporting and clamping assembly set forth in claim 10, the substrate support system comprising a plurality of pins adapted to engage and support the bottom surface of the substrate.

13. The stencil printer set forth in claim 8, wherein the at least one support member is constructed and arranged to raise the substrate into the print position.

14. The stencil printer set forth in claim 8, wherein the supporting and clamping assembly further comprises a foil member to prevent a z directional movement of the substrate.

15. A substrate supporting and clamping assembly for supporting and clamping a substrate in a print position during a print operation of a stencil printer, the substrate supporting and clamping assembly comprising:
   means for engaging a bottom surface of the substrate in a print position; and
   means for clamping opposite edges of the substrate, said means for clamping comprising a pair of rail members and a clamping mechanism configured to move the at least one of the rail members between a first position in which the rail member is spaced away from one of the opposite edges of the substrate and a second position in which the rail member engages one of the opposite edges of the substrate to clamp the substrate between the rail members during a print operation, said means for clamping further comprising means for controlling a clamping force applied to the rail member against the edge of the substrate.

16. The substrate supporting and clamping assembly set forth in claim 15, wherein the clamping force is between 1 and 35 pounds.

17. The substrate supporting and clamping assembly set forth in claim 15, further comprising means for raising the substrate to the print position.

18. The substrate supporting and clamping assembly set forth in claim 15, further comprising means for preventing a z directional movement of the substrate.

19. A method for supporting and clamping a substrate in a print position during a print operation of a stencil printer, the method comprising:
   supporting the substrate at the print position;
   clamping opposite edges of the substrate; and
   controlling a clamping force at which the substrate is clamped.

20. The method set forth in claim 19, wherein the clamping force is between 1 and 35 pounds.

21. The method set forth in claim 19, further comprising raising the substrate to the print position.

22. The method set forth in claim 19, further comprising preventing a z directional movement of the substrate.

23. An apparatus for performing an operation on an electronic substrate, the apparatus comprising:
   a frame;
   a module, coupled to the frame, to perform an operation on the electronic substrate;
   a substrate support, coupled to the frame, to support a substrate in an operating position; and
   a substrate clamping assembly, coupled to the frame, the substrate clamping assembly comprising
   a pair of rail members coupled to the frame, said rail members being adapted to engage opposite edges of the substrate, and
   a clamping mechanism, coupled to the frame, to move at least one of the rail members against the substrate to clamp the substrate, said clamping mechanism being configured to move the at least one of the rail members between a first position in which the rail member is spaced away from one of the opposite edges of the substrate and a second position in which the rail member engages one of the opposite edges of the substrate to clamp the substrate between the rail members during a print operation, said clamping mechanism comprising a pressure regulator to control a clamping force applied to the rail member against the edge of the substrate.

24. The apparatus set forth in claim 23, wherein the clamping force is between 1 and 35 pounds.

25. A substrate clamping assembly for clamping a substrate in a position during an operation on an electronic substrate, the substrate clamping assembly comprising:
   a pair of rail members adapted to engage opposite edges of the substrate; and
   a clamping mechanism to move at least one of the rail members against the substrate to clamp the substrate, said clamping mechanism being configured to move the at least one of the rail members between a first position in which the rail member is spaced away from one of the opposite edges of the substrate and a second position in which the rail member engages one of the opposite edges of the substrate to clamp the substrate between the rail members during a print operation, said clamping mechanism comprising a pressure regulator to control a clamping force applied by to the rail member against the edge of the substrate.

26. The substrate clamping assembly set forth in claim 25, wherein the clamping force is between 1 and 35 pounds.

* * * * *